(12) United States Patent
Kern et al.

(10) Patent No.: US 11,314,642 B2
(45) Date of Patent: Apr. 26, 2022

(54) UPDATING A MEMORY

(71) Applicant: Infineon Technologies AG, Neubiberg (DE)

(72) Inventors: Thomas Kern, Ascheim (DE); Robert Allinger, Unterhaching (DE); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 421 days.

(21) Appl. No.: 16/058,620

(22) Filed: Aug. 8, 2018

(65) Prior Publication Data

US 2019/0057031 A1 Feb. 21, 2019

(30) Foreign Application Priority Data

Aug. 21, 2017 (DE) .......................... 102017119065.1

(51) Int. Cl.
*G06F 12/02* (2006.01)
*G06F 12/0804* (2016.01)
(Continued)

(52) U.S. Cl.
CPC .......... *G06F 12/0804* (2013.01); *G06F 3/064* (2013.01); *G06F 3/0608* (2013.01); *G06F 3/0614* (2013.01); *G06F 3/0679* (2013.01); *G06F 12/0246* (2013.01); *G11C 11/5635* (2013.01); *G11C 16/16* (2013.01); *G11C 2211/5641* (2013.01)

(58) Field of Classification Search
CPC .... G06F 12/0804; G06F 3/0608; G06F 3/064; G06F 3/0679; G06F 12/0246; G11C 11/5635; G11C 16/16; G11C 2211/5641
See application file for complete search history.

(56) References Cited

U.S. PATENT DOCUMENTS 9,229,644 B2 * 1/2016 Ng ........................... G06F 3/065
2014/0164687 A1 * 6/2014 Kwon ................... G06F 3/0616
711/103
(Continued)

FOREIGN PATENT DOCUMENTS

CN 106990982 A 7/2017

OTHER PUBLICATIONS

German Patent Office, Office Action issued for DE 102017119065.1, 14 pgs., dated Jun. 13, 2018.

*Primary Examiner* — Jason W Blust
*Assistant Examiner* — Eric T Loonan
(74) *Attorney, Agent, or Firm* — Banner Witcoff

(57) ABSTRACT

A method for updating a memory, which comprises several blocks, wherein each of the several blocks comprises multi-level cells and is operable in an MLC-mode or in a SLC-mode, wherein each multi-level cell may store more than one bit, wherein the method includes for each block to be updated: (a) copying the content of the block to a buffer block; (b) erasing the block; (c) writing the content of the block from the buffer block and an updated content for this block to this block, utilizing the capability of the block to be operated in the MLC-mode; (d) copying the updated content of the block to the buffer block; (e) erasing the block; and (f) writing the updated content from the buffer block to the block, utilizing the capability of the block to be operated in the SLC-mode. Also, therefore is a corresponding device.

23 Claims, 15 Drawing Sheets

(51) Int. Cl.
*G06F 3/06* (2006.01)
*G11C 11/56* (2006.01)
*G11C 16/16* (2006.01)

(56) References Cited

U.S. PATENT DOCUMENTS

| | | | |
|---|---|---|---|
| 2015/0301821 A1* | 10/2015 | Danne | H04L 67/06 717/169 |
| 2016/0041760 A1* | 2/2016 | Kuang | G11C 16/3495 711/103 |
| 2016/0268000 A1 | 9/2016 | Thompson et al. | |
| 2017/0147232 A1* | 5/2017 | Hung | G06F 3/0658 |

* cited by examiner

UPDATING A MEMORY

BACKGROUND

Embodiments of the present disclosure relate to an efficient approach for updating data of a memory.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Figure 1A:
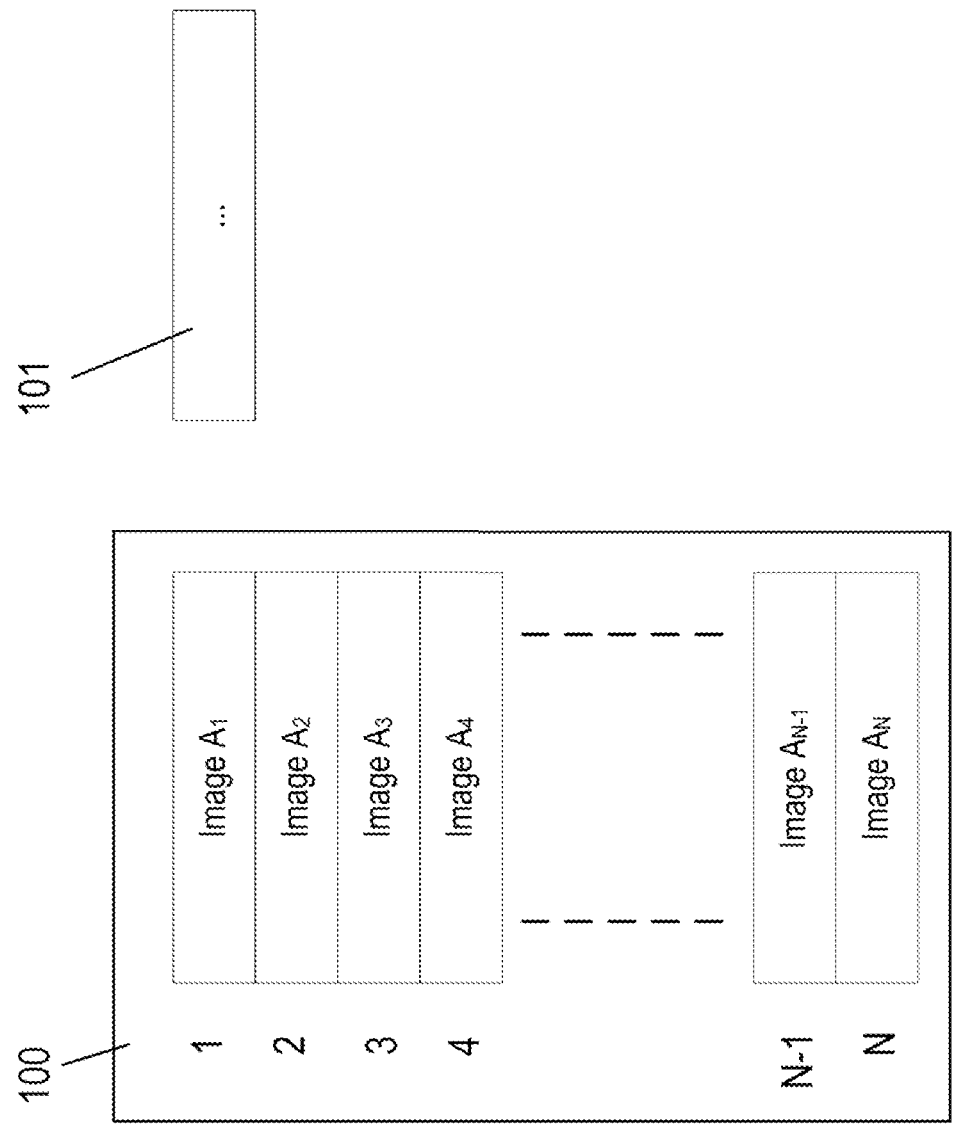
FIG. 1A to 1M visualize steps to update a memory comprising MLCs from an image A to an image B.

In the automotive field, product recalls and other updates that involve software in the vehicle have an increasing demand to be conducted online, e.g., via an Internet connection. Any download, update or revision of data that is conducted online over an air interface, e.g., a mobile communication interface, is also referred to as SOTA (Software Over the Air). The advantages of SOTA extend from a mere correction of errors towards adding new software with new features that can be conveniently installed in the vehicle without any significant downtime. Hence, the user does no longer have to drive the vehicle to the garage and wait for the update to be conducted.

SOTA may increasingly be used by Original Equipment Manufacturers (OEMs), which significantly benefit from updating the functionality and the features of the vehicle "over the air" (online).

In particular one of the following scenarios (1) to (3) may be used to enable SOTA:
(1) The vehicle may comprise a microcontroller, a PFlash memory and a communication interface. The microcontroller may be coupled to the PFlash memory and the communication interface via a bus. The communication interface is connectable with a central storage unit in the vehicle. It is noted that the central storage unit may be located inside the vehicle or it may be arranged external to the vehicle. The central storage may in particular be a buffering memory. The microcontroller, PFlash memory and communication interface may be part of an Electronic Control Unit (ECU) of the vehicle.
In this scenario (1), the software update is conducted from the central storage via the communication interface to the PFlash memory.
It is noted that instead of the microcontroller at least one core and/or at least one CPU (Central Processing Unit) can be used. It is also an option that the microcontroller comprises the PFlash memory and/or the communication interface.
(2) In contrast to scenario (1), the ECU comprises an additional serial peripheral interface (SPI) that is connected to the bus. A local storage that may be part of the ECU is connected to the SPI.
In this scenario (2), the software update is conducted from the central storage via the communication interface to the local storage. This scenario (2) decreases the downtime compared to scenario (1), but it increases the cost due to the additional components required.
(3) In contrast to scenario (1), the ECU comprises an additional PFlash memory that is connected to the bus.
In this scenario (3), the software update can be conducted into the doubled (second) PFlash memory and the memories may be swapped after a successful download. Compared to the scenarios (1) and (2), this scenario further decreases the downtime, but it also further increases the cost due to the costly second PFlash memory.

It is noted that the PFlash memory may be any Code-Flash memory or Instruction-Flash memory, which may comprise code and/or static or low frequent data portions.

Conventional embedded flash technologies (in contrast to stand-alone memories) may be in particular based on a 1 bit per cell solution, i.e. one bit of information is stored in a single memory cell. This especially applies for PFlash solutions due to the fact that they do not reveal high update rates and thus do not sustain significant stress and/or degradation by high write/erase cycles. Classical and mature embedded non-volatile-memory concepts like Floating Gate Flash generate significantly more integrations problems reaching advanced technology nodes (e.g., deploying High k metal gate processes). This easier integration in a CMOS ase (advanced silicon etching) process and eventually lower cost make emerging memory solutions like PCRAM, ReRAM, MRAM and others attractive. However, emerging memory concepts sometimes lack maturity and reliability.

Example described herein utilize multi-level cells (MLCs). The MLC is a memory element capable of storing more than a single bit of information, whereas a single-level cell is a memory element capable of storing a single bit of information (SLCs).

A memory that comprises MLCs (also referred to as MLC memory) may be operated in an MLC-mode or in a SLC-mode. The MLC-mode utilizes the feature of the memory cells that allow storing more than one bit of information per single cell. The SLC-mode utilizes the feature that only a single bit is stored per memory cell. The memory may be partitioned into blocks, wherein each block comprises at least one memory cell, in particular at least two memory cells. The block may be subject to an erase operation; hence, an erase operation directed to a block erases the content of this block.

Using the SLC-mode of the MLC memory increases the reliability of the memory elements affected by the SLC-mode. This applies in particular considering the overall operating lifetime of the memory, especially in high temperature environments.

An update may be flexibly triggered depending on, e.g., at least one of the following inputs or conditions based on at least one of these inputs: a parameter, an internal temperature, an external temperature, a measured signal (e.g., a voltage, a current, a trend of a voltage or current), a predetermined signal. The input may be considered before data is written to the memory or when data is written to the memory as part of the update process. For example, a stability of a voltage may influence the update: if such stability (variation over time) is within a predefined limit, the write operation (as part of the update) will be conducted, otherwise the write operation is, e.g., delayed.

The following examples visualized in FIG. 1A to FIG. 1M show an approach to update a memory comprising MLCs from an image A to an image B (also referred to as A/B swap). The solution presented is highly efficient and involves only a small amount of overhead.

FIG. 1A shows a memory 100 comprising N blocks. Each of the N blocks comprises a predetermined number of (e.g., 64) memory cells. Each of the memory cells is a multi-level memory cell, i.e. it is capable of storing more than a single bit. Each of the N blocks can be operated in the MLC-mode or in the SLC-mode.

In addition, a block 101 (also referred to as buffer block) is provided, which has at least the size of any of the N blocks. The block 101 may be an additional block of the memory 100 or it may be part of a different memory. The memory cells of the block 101 may be MLCs, but they could also be SLCs.

FIG. 1B to FIG. 1M share the same memory 100 and block 101 as is shown in FIG. 1. However, the content varies as will be shown.

In FIG. 1A, the memory 100 comprises an image A, which is partitioned in images $A_i$, wherein each block i (i=1, . . . , N) of the N blocks comprises an image $A_i$. At this point, the content of the block 101 does not matter; this is indicated by " . . . " in FIG. 1A.

It is noted that a target image B is partitioned in images $B_i$, wherein each image $B_i$ is to be stored in one of the blocks i (i=1, . . . , N) of the memory 100.

Figure 1B:
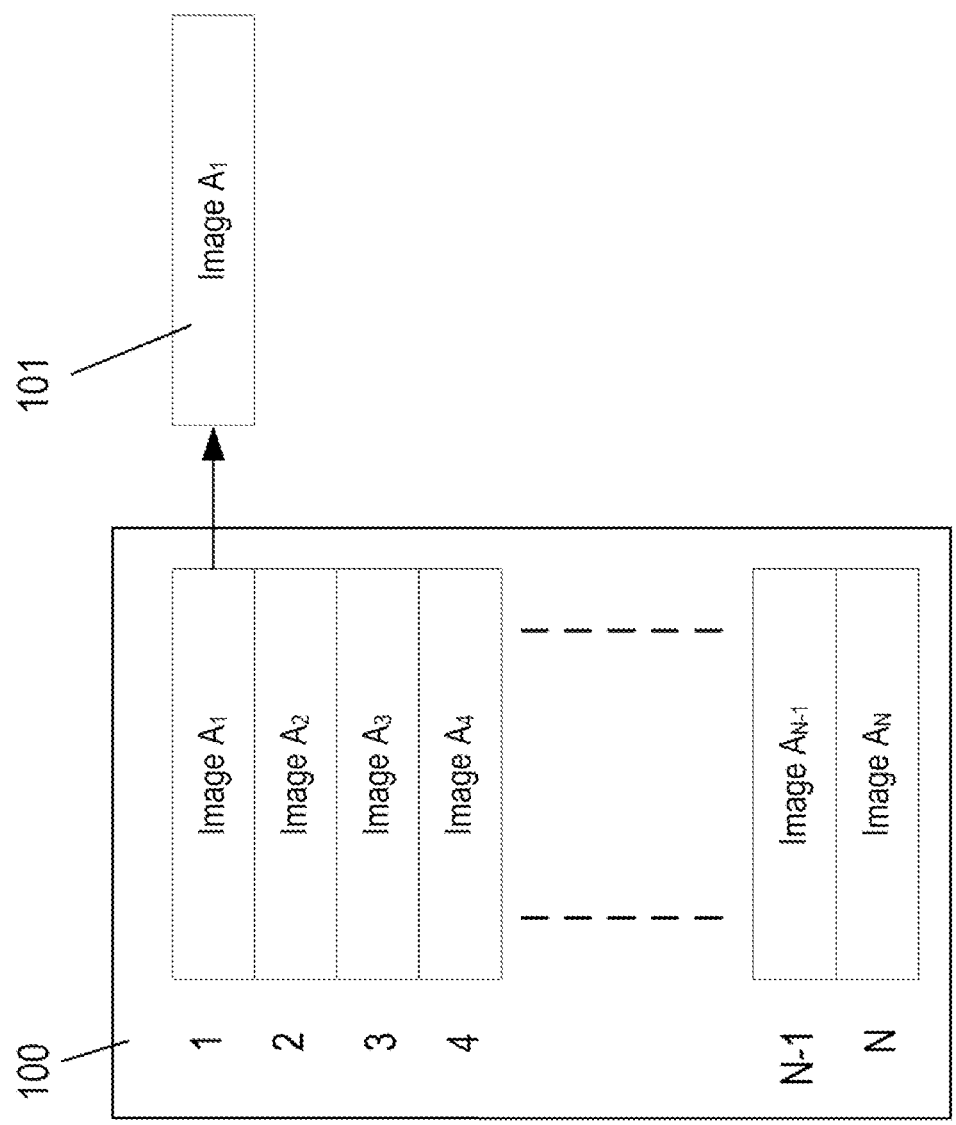

FIG. 1B shows that the image $A_1$ of the first block is copied to the block 101. After this copy operation has been successfully completed, the image $A_1$ can be accessed via the block 101. This can be achieved via an address mapping that allows the CPU accessing the memory to read the block 101 instead of the first block of the memory 100.

Figure 1C:
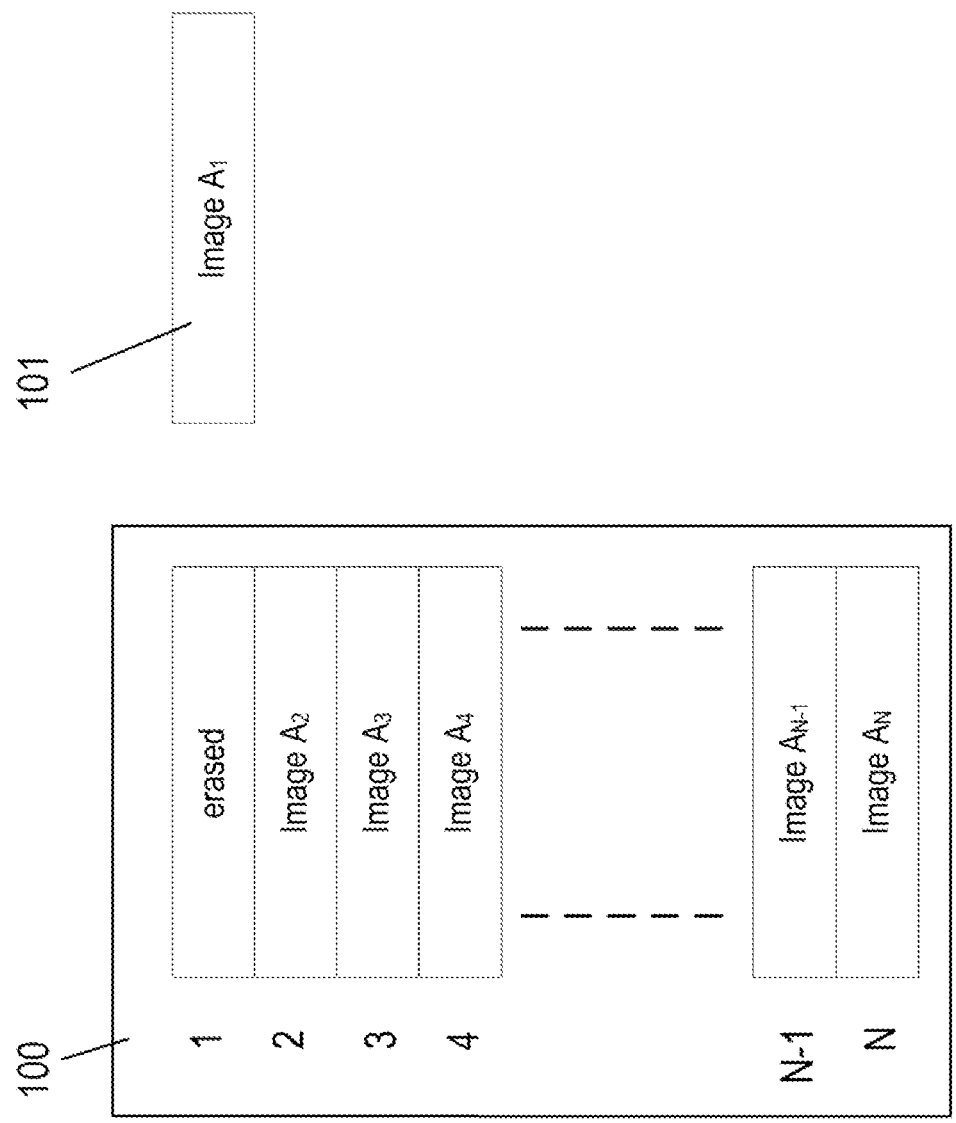

FIG. 1C shows that (the content of) the first block is erased. As the read operation is directed to the block 101 instead of the first block of the memory 100, this first block can be erased without disrupting the overall operation.

Figure 1D:
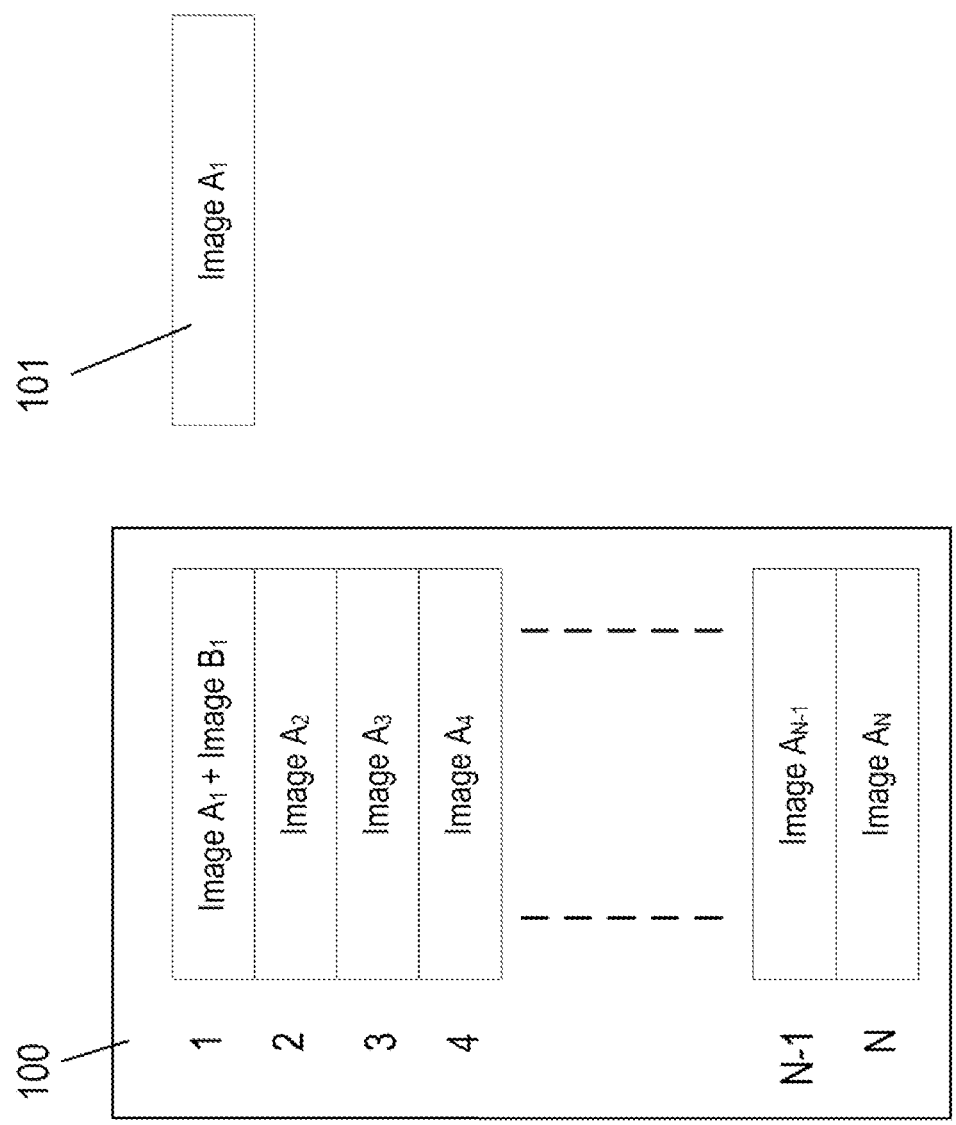

FIG. 1D shows that the image $A_1$ from the block 101 and an image $B_1$ (i.e. the first block of the updated image) are stored in the previously erased first block of the memory 100 thereby utilizing the MLC-mode (e.g., 2 bit per cell) of the first block. In case of two bits per cell are utilized, the MLC mode provides double capacity and thus both images can be stored in the first block.

If a classical floating gate or charge trapping cell is used, an erase operation is conducted prior to writing. If a bit can be individually changed between the two (SLC) or four states (MLC), the erase operation may be omitted.

The image $B_i$ is a part of the new image B which may be stored locally in the vehicle. It may well be that the memory capacity suffices to store several images B, B', B", etc. This may apply even in case the ECU comprises a local storage unit. In such case, there may be no necessity to store the image merely temporarily.

However, as long as the complete new image B is not stored in the Flash memory, there is no possibility to simply switch to and hence enable the new image. Hence, the new image B needs to be updated to the Flash memory. The streaming rate that is utilized during the update may be considerably low since there is no critical timing associated with the update.

It is an option that updating an image may depend on inputs and/or conditions as described above. For example, temperature exceeding a predetermined temperature may be avoided during an update to guarantee the data consistency when the MLC mode is used.

The decision whether to utilize the MLC mode or the SLC mode can be made based on, e.g., a single bit. A configuration register comprising at least one bit may be used to store MLC/SLC mode information for at least one memory block of a memory.

It is an option that a recognition rate and/or an error correction mechanism is adapted to the MLC or SLC mode. Also, an integrity check may be adapted or even provided depending on the MLC or SLC mode.

It is a further option that several different MLC modes can be utilized based on the information stored in the configuration register. In this case, more than one bit of information can be used to determine the mode to be utilized. The mode may be the SLC mode, a first MLC mode, a second MLC mode, etc. Different MLC modes are arranged to store 2, 3 or more bits of information in a single memory element.

Hence, after the step shown in FIG. 1D, the first block is operated in the MLC-mode and contains the image $A_1$ as well as the image $B_1$.

Now, the read access can be directed to the first block of the memory 100 (instead of the block 101) to access the image $A_1$. The additional information, i.e. the image $B_1$, can be masked, ignored or checked.

Figure 1E:
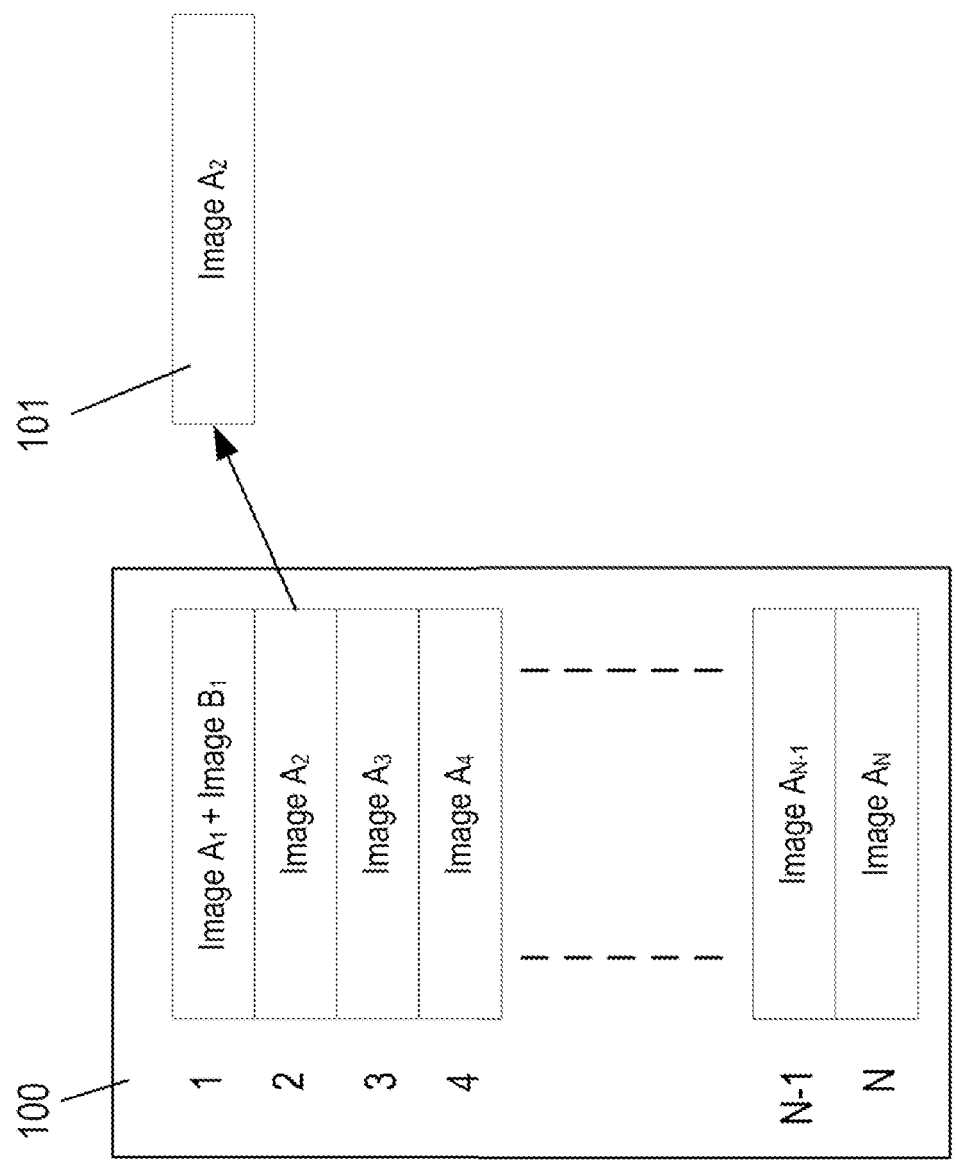

FIG. 1E shows that the second image $A_2$ is stored in the block 101. After this copy operation has been successfully completed, the image $A_2$ can be accessed via the block 101. This can be achieved via an address mapping that allows the CPU accessing the memory to read the block 101 instead of the second block of the memory 100.

Figure 1F:
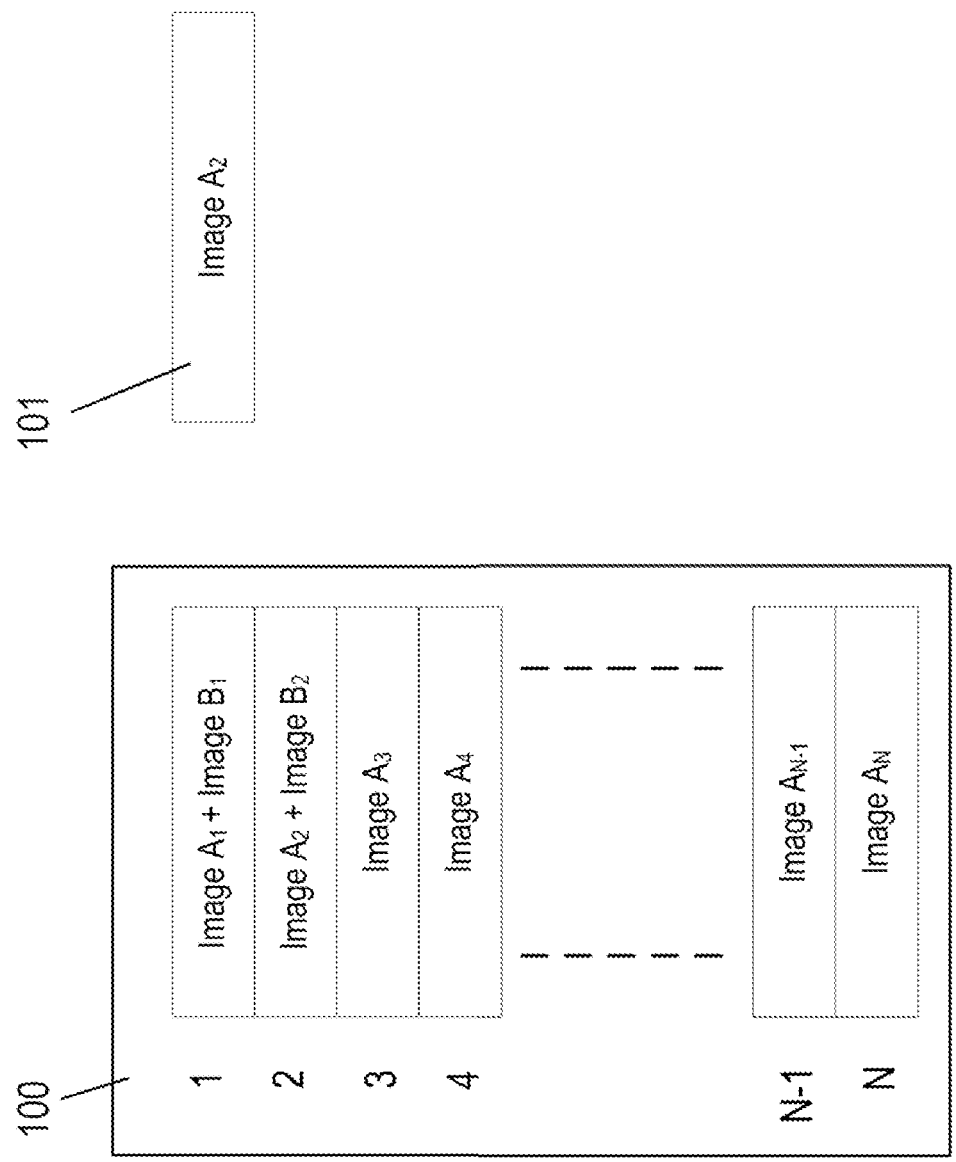

FIG. 1F shows that after the second block of the memory 100 has been erased, the image $A_2$ from the block 101 and an image $B_2$ (i.e. the second block of the updated image) are stored in the second block—now operated in the MLC mode—of the memory 100.

Now, the read access can be directed to the second block of the memory 100 (instead of the block 101) to access the image $A_2$. The additional information, i.e. the image $B_2$, is masked, ignored or checked.

This process is continued for all subsequent blocks of the memory 100, i.e. the third block up to the N-th block.

Figure 1G:
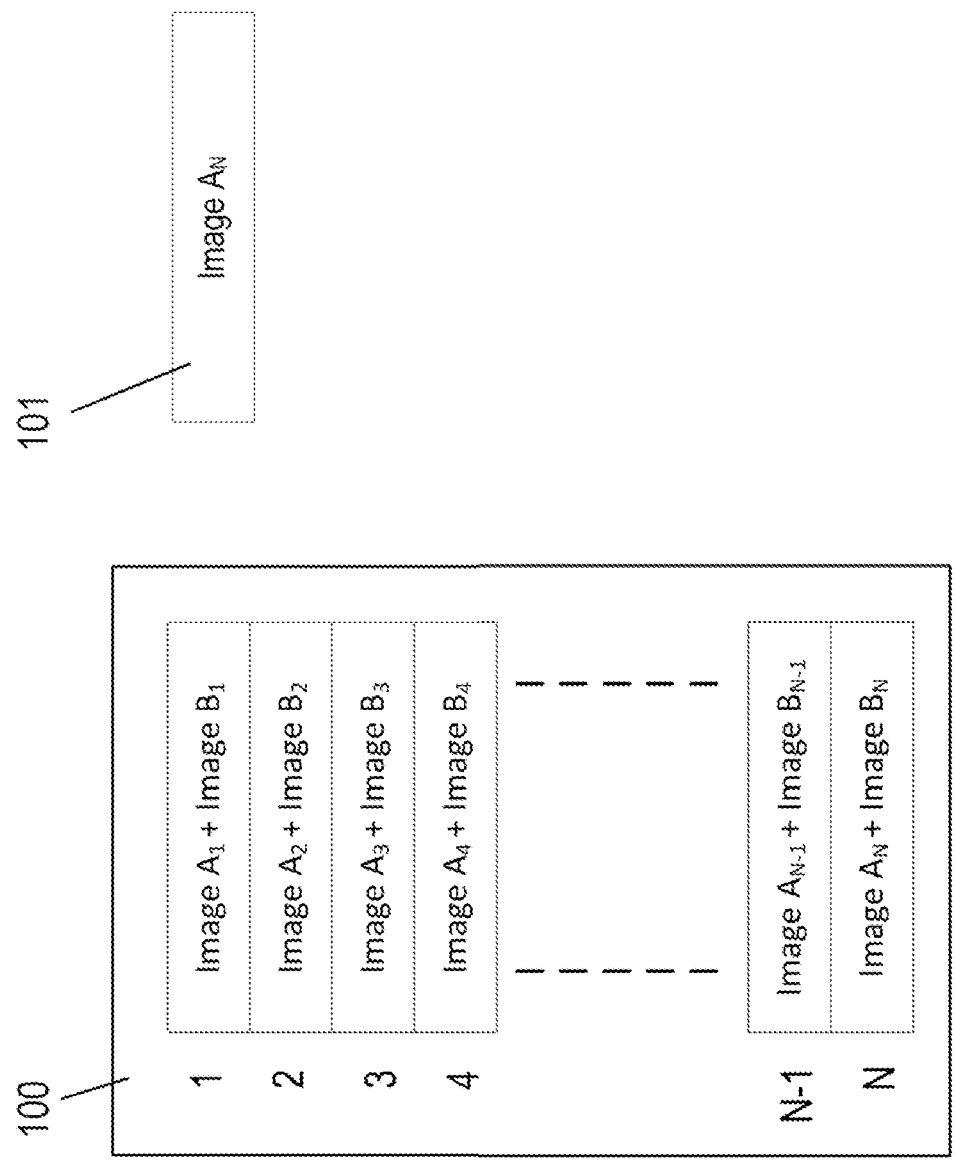

FIG. 1G shows the state of the memory 100 after all blocks i comprise two image portions $A_i$ and $B_i$ after the last image $B_N$ has been written to the N-th block of the memory 100. This N-th block comprises the image $A_N$ and the image $B_N$. By masking or ignoring the images $B_i$ the memory 100 is used to supply the image A (via the images $A_i$) for further processing purposes.

However, at this point (i.e. after the last image $B_N$ of the image B has been added to the memory 100), it can be switched from the image A to the image B by masking or ignoring the images $A_i$ and accessing the images $B_i$ for further processing purposes. This effectively finishes the update (or swapping), because from this moment on the updated image B can be used.

In order to increase the reliability of the memory 100, however, the image A will be erased from the memory 100 and the memory will then be operated in the SLC-mode comprising only the image B. This is visualized in the next steps.

Figure 1H:
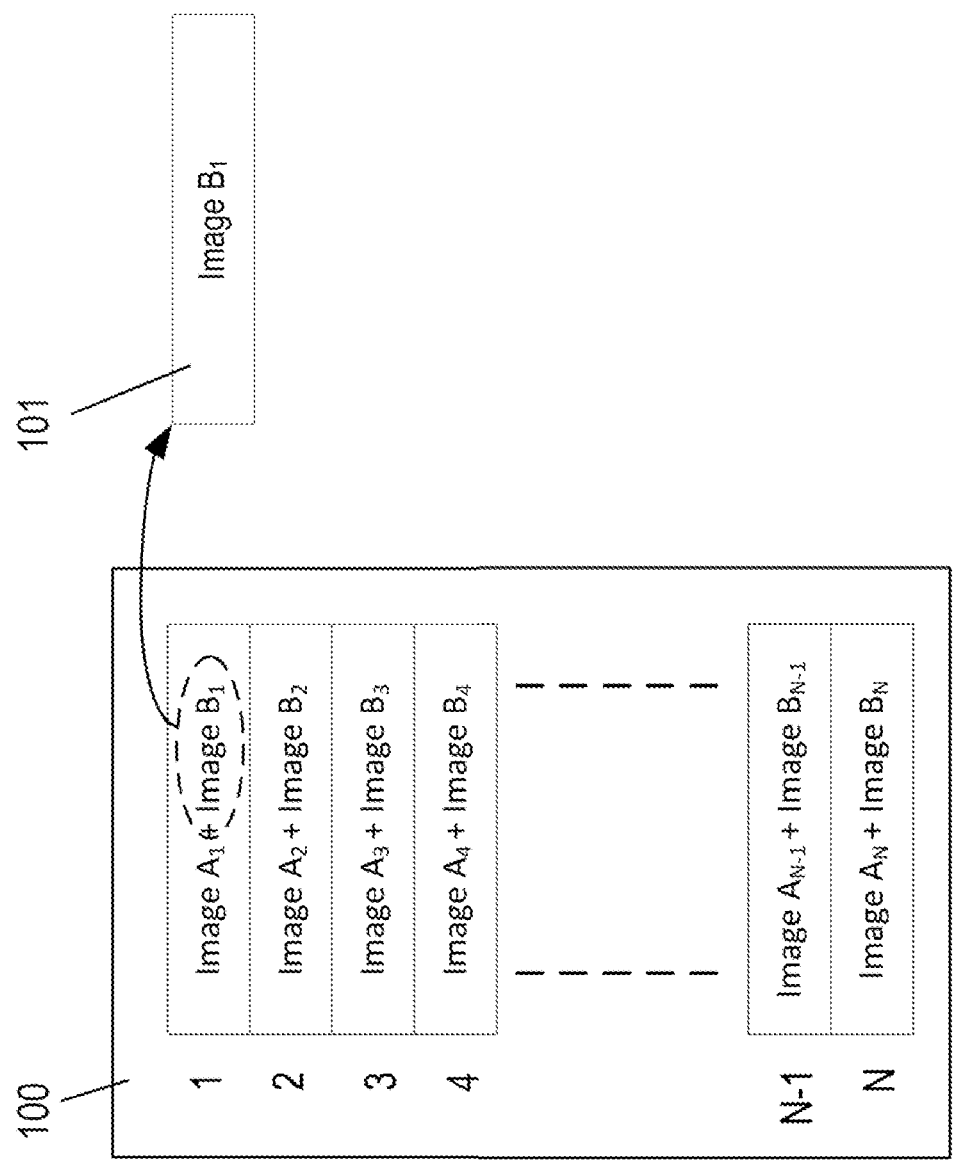

FIG. 1H shows that the image $B_1$ is copied from the first block of the memory 100 to the block 101. After this copy operation has been successfully completed, the image $B_1$ can be accessed via the block 101, i.e. the block 101 can be read instead of the first block of the memory 100.

Figure 1I:
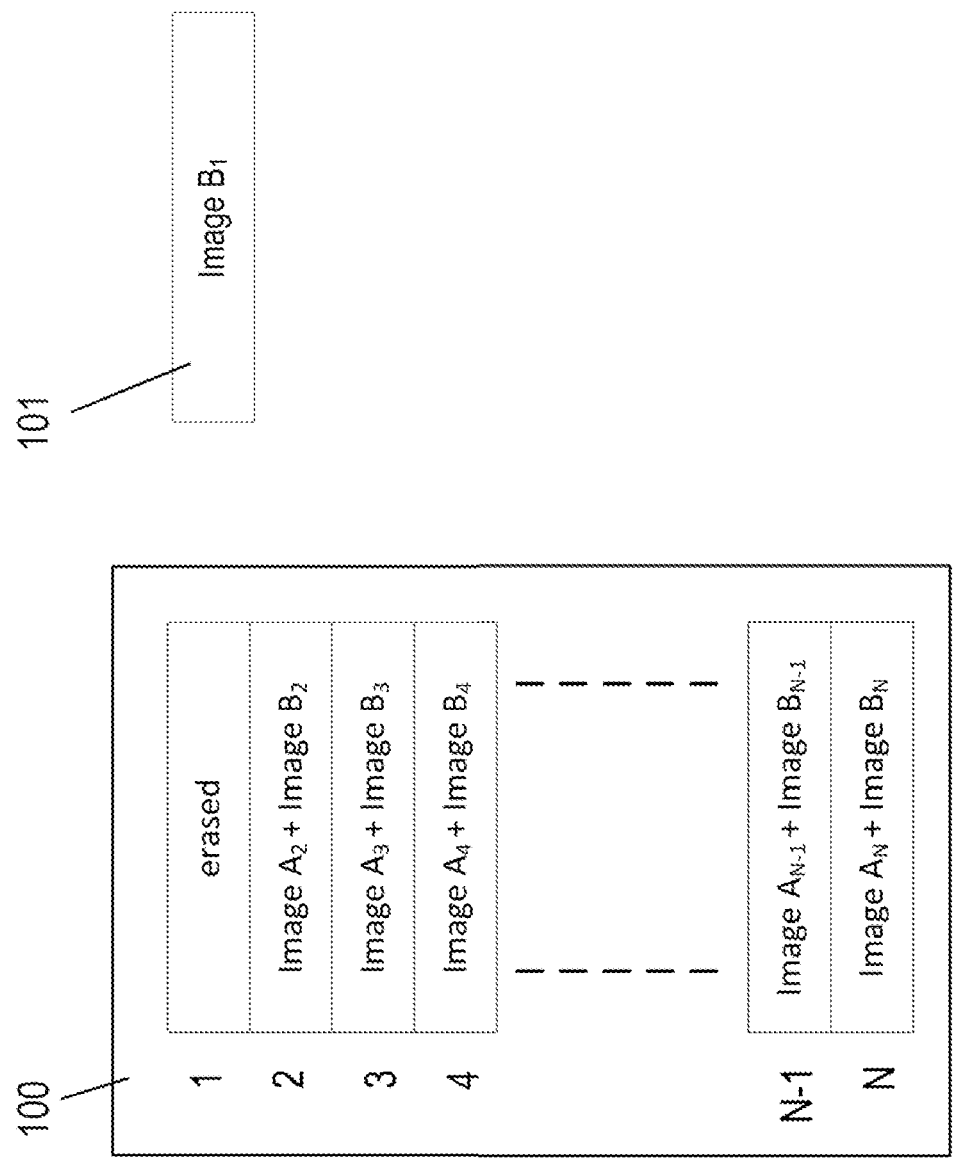

FIG. 1I shows that the first block of the memory 100 is erased.

Figure 1J:
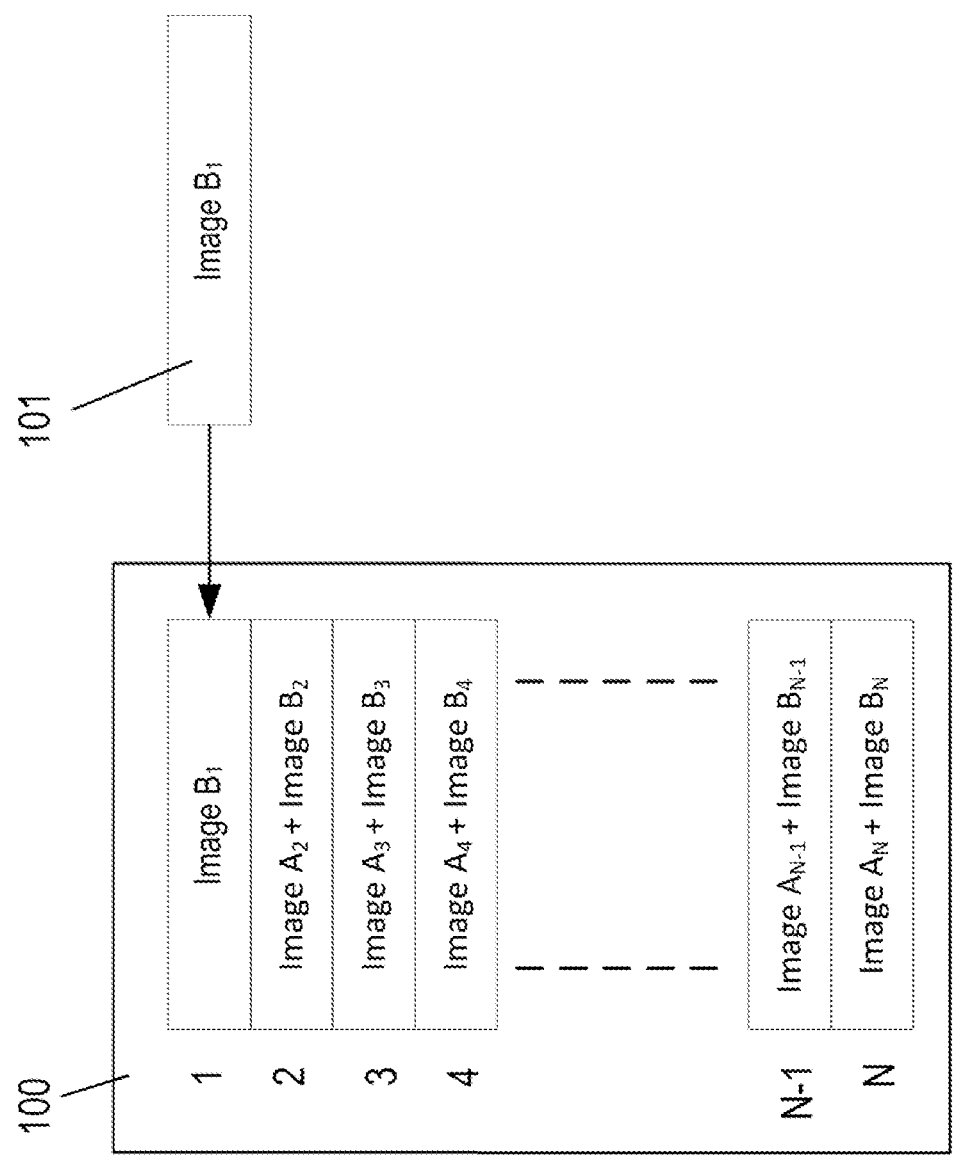

FIG. 1J shows that first block of the memory 100 is switched to the SLC mode and that the image $B_1$ is written from the block 101 to the first block of the memory 100.

Then, the image $B_1$ can be accessed via the first block of the memory 100 and the block 101 can be used for further copying operations.

Figure 1K:
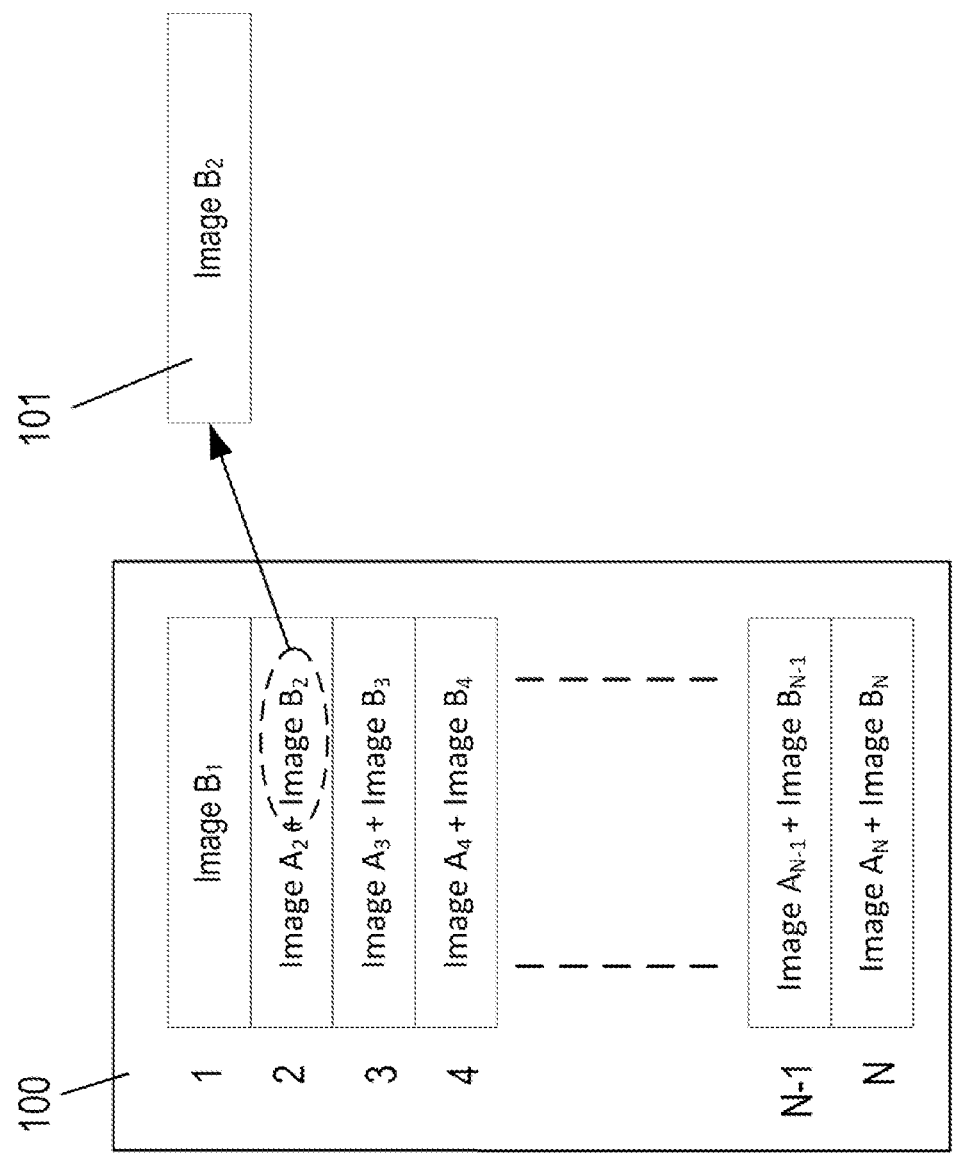

FIG. 1K shows that the image $B_2$ is copied from the second block of the memory 100 to the block 101. After this copy operation has been successfully completed, the image $B_2$ can be accessed via the block 101, i.e. the block 101 can be read instead of the second block of the memory 100.

Figure 1L:
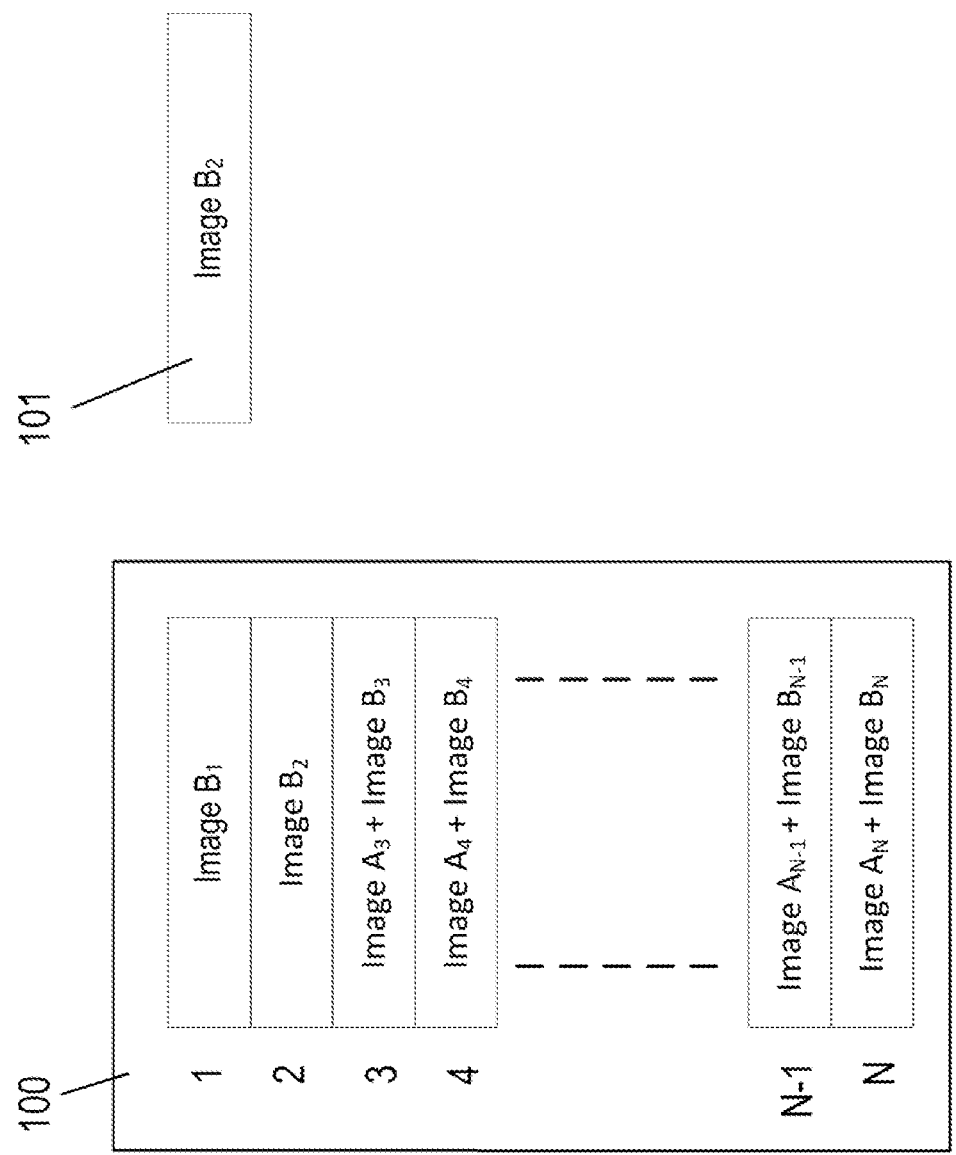

FIG. 1L shows that after the second block of the memory 100 has been erased the image $B_2$ is copied from the block 101 to the second block of the memory. Then, the image $B_2$ can be accessed via the second block of the memory 100 and the block 101 can be used for further copying operations.

This is continued for of the remaining blocks 3 to N of the memory 100.

Figure 1M:
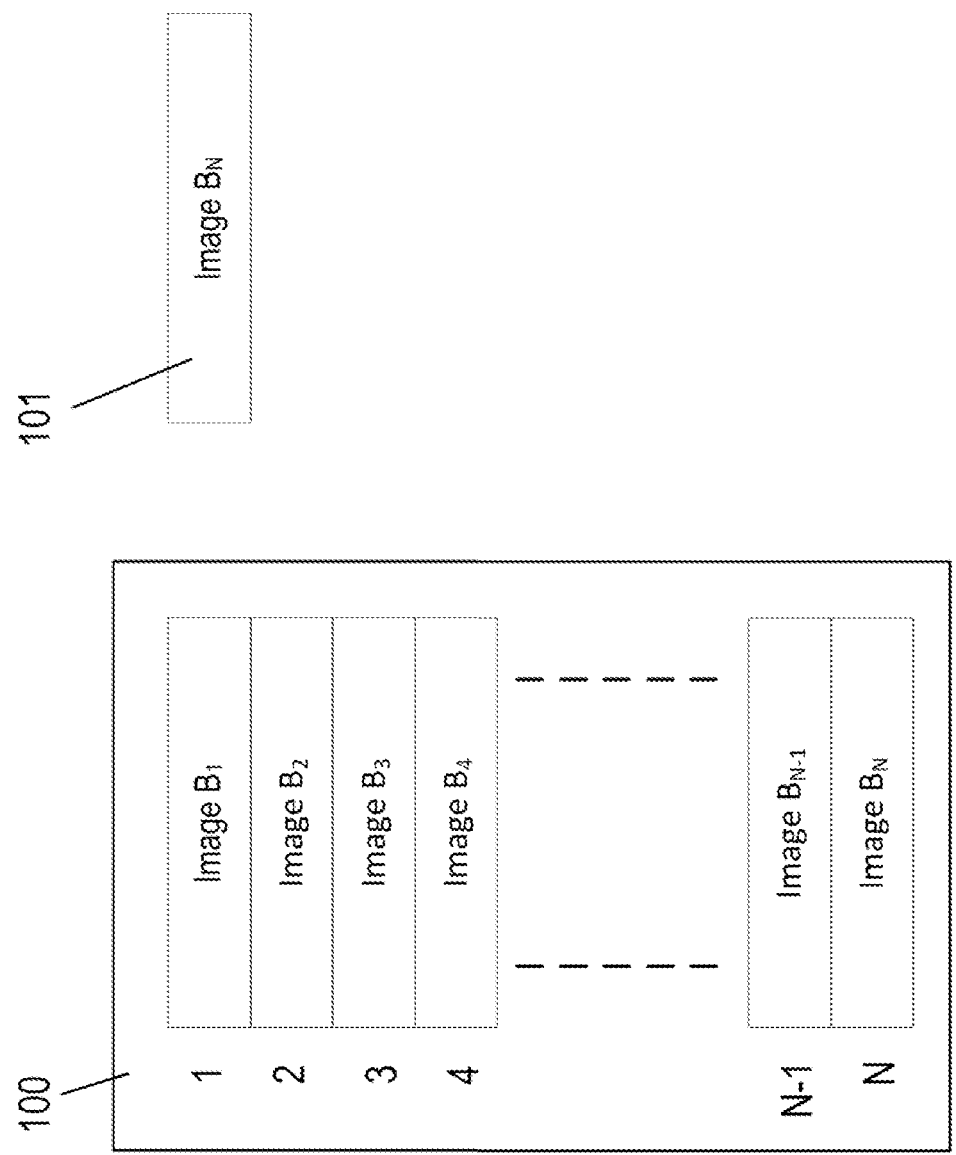

FIG. 1M shows the final result, i.e. the memory 100 operated in the SLC-mode comprising only one image $B_i$ per block i (i=1, . . . , N).

Hence, the solution presented allows swapping between two images A and B using only one additional block 101 for buffering purposes. The memory 100 containing the images A and/or B can be operated in the MLC-mode or the SLC-mode, wherein the block 101 does not have to comprise multi-level cells.

The solution is cost-efficient. Also, this approach predominately utilizes the higher reliability of the SLC-mode over the MLC-mode and only temporarily switches the MLC memory 100 to the less reliable MLC-mode, e.g., during the update phase as described herein. As an option, a single block can be written and verified while all other blocks can be read (in parallel); this is also referred to as "read-while-write"-feature.

Examples disclosed herein could be implemented by upgrading a portion of a memory (or the whole memory) to multi-level cell memory. Such MLC memory allows being operated in the MLC-mode or in the SLC-mode. Each memory cell of the MLC memory may have the capability to store several bits, in particular two bits.

It is an option that the SLC-mode or the MLC-mode of the MLC memory can be selected (e.g., switched) by a user or customer.

The MLC memory being in the MLC-mode may involve a higher latency compared to it being in the SLC-mode. In such case, it may be an option that the system accessing the memory (at least temporarily) runs at a lower speed to compensate for this latency. It is in particular an option that this system operates at a speed that corresponds to the memory being in the MLC-mode.

It is also an option that when the MLC memory is in the MLC-mode integrity checks are executed. This is in particular useful during updates which last longer than a predetermined period of time. Further, such integrity checks or additional integrity checks may be conducted in case a temperature reaches and/or exceeds a predetermined threshold.

Preserving the data in the memory may depend via the activation energy with the temperature. For example, floating gate based Flash memory have an activation energy amounting to 1 eV for retaining the floating gate charge. If a driving cycle for a vehicle is designed to cope with a temperature of 125° C. for 10 hours, a single hour of driving at a temperature of 160° C. may already exceed the design limitation due to the high influence of the temperature on the preservation of the data.

A reliability diagnosis may be conducted prior to entering the MLC-mode. Such diagnosis may be conducted utilizing a reduced read distance, e.g., $Iref_i+/-\Delta Iref_i$, i=1 . . . 3, between the current distributions to check whether single bits are already flipping. The read results at the currents $+\Delta Iref_i$ and $-\Delta Iref_i$ are compared with each other; if the results differ from one another there is a read error. The data read may then be marked or an error correction may be used to derive the correct data based on the read error. However, the result of such diagnosis shows the limitations of using the MLC for a block or even another portion of the memory.

Figure 3:
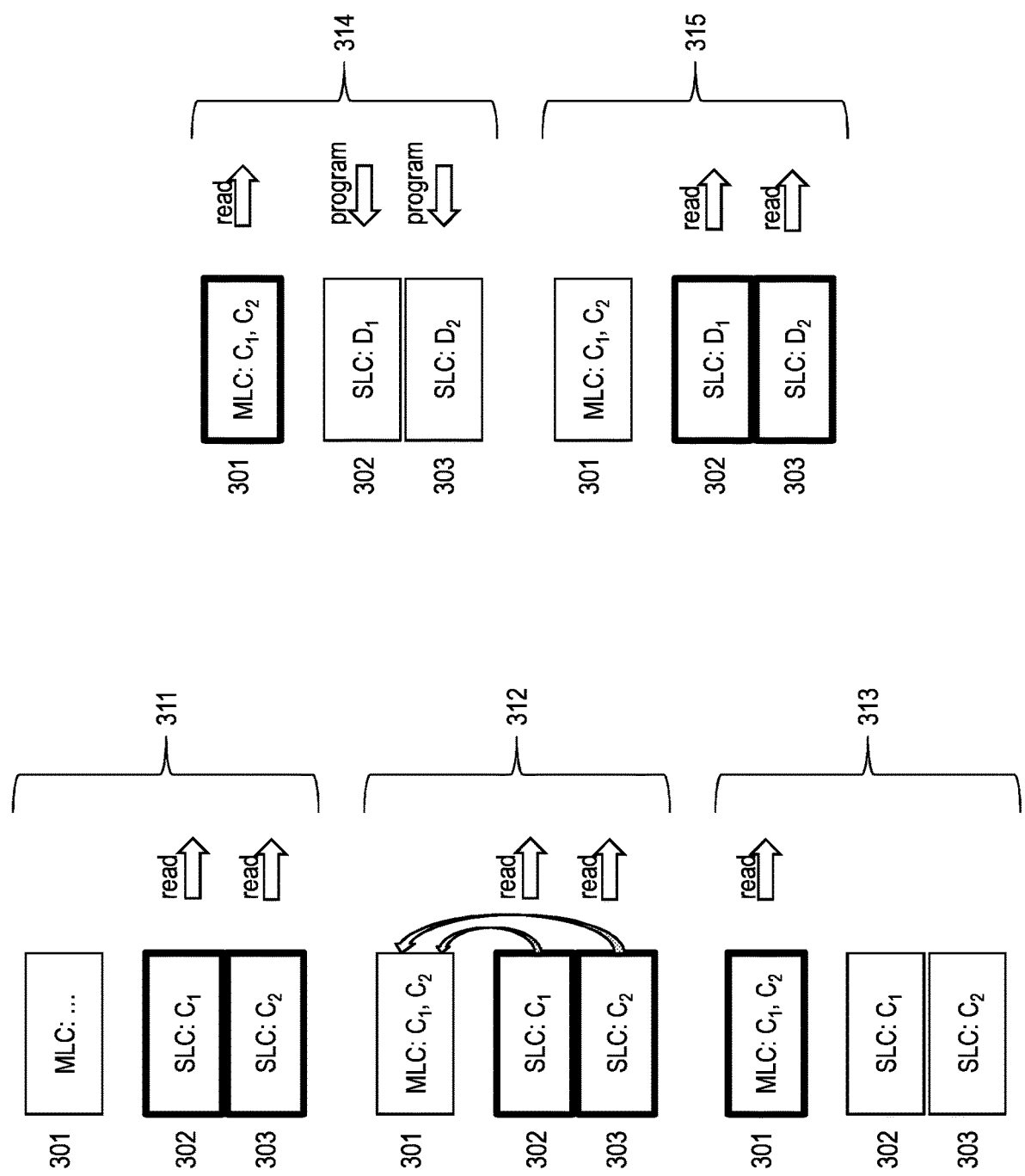
FIG. 3 shows steps to update a memory from an image $C_1$, $C_2$ to an image $D_1$, $D_2$ using a buffer that is operated in the MLC-mode.

FIG. 3 shows an alternative approach to update a memory utilizing a memory portion that is capable to be operated in the MLC mode. This memory portion may be a block of a predetermined size.

FIG. 3 shows three memory portions (also referred to as memories) 301, 302 and 303. The memory 301 (also referred to as buffer or buffer memory in this example) can be operated in the MLC mode, the memory 302 and the memory 303 can each be operated in the SLC mode (in particular not in the MLC mode). The memories 302 and 303 may have the same size and the memory 301 has twice the size as each of the memories 302, 303. It is also an option that the memory 301 is capable of storing at least the data stored in the memory 302 and the memory 303.

The update from an image $C_1$ stored in the memory 302 to an image $D_1$ and from an image $C_2$ stored in the memory 303 to an image $D_2$ can be described as follows:

In a step 311, the image $C_1$ is stored in the memory 302 and the image $C_2$ is stored in the memory 303. The images $C_1$, $C_2$ are read from the memories 302, 303. The buffer 301 may be empty.

In a step 312, the image $C_1$ and the image $C_2$ are programmed from the memories 303 and 303 to the buffer 301. The buffer 301 is operated in the MLC mode and (in this mode) is capable of storing the contents of both memories 302 and 303.

In a step 313, the images $C_1$, $C_2$ are read from the buffer 301. Hence, the buffer 301 supplies the data of these images to an application. An address mapping ensures that access to the images $C_1$, $C_2$ is no longer conducted via the memories 302, 303, but through the buffer 301 instead.

In a step 314, the updated images $D_1$, $D_2$ are programmed to the memories 302, 303. The images $C_1$, $C_2$ are still read from the buffer 301.

In a step 315, after the update of the images $D_1$, $D_2$ is finished, the updated images $D_1$, $D_2$ are read from the memories 302, 303. The address mapping ensures that access to the images $D_1$, $D_2$ is done via the memories 302, 303. The buffer 301 still containing the images $C_1$, $C_2$ may be erased or it may be directly re-written during the next update.

It is noted that in FIG. 3 the arrows indicated a read or program operation. The bold outlined boxes indicate the boxes which supply the image to a processor (i.e. the currently active image). It is further noted that the buffer 301 may preferably temporarily used for buffering the update, whereas in normal operation (different from the update itself) the memories 302 and 303 provide the images for a processing unit (e.g., said processor).

It is an advantage of the arrangement shown in FIG. 3 that the buffer 301 is larger than each of the memories 302 or 303 and that the update can be conducted quickly. There is in particular no detour required that may involve temporarily storing buffer data in any of the memories 302, 303, which are operated in the SLC mode.

It is a further advantage that the whole buffer 301 can be checked in particular before it is used in the MLC mode. The buffer 301 may also be used in the SLC mode when it is not involved in an update process.

It is yet another advantage that the memory 301 is assigned to a first processor and that the memories 302, 303 are assigned to a second processor. The main application may hence run either on the first processor during steps 313 or 314 or on the second processor during steps 311, 312 and 315.

The memory 301 and the memories 302/303 may be updated independently from one another.

Hence, the approach described herein uses the MLC-mode of a MLC memory for a limited period of time (e.g., during an update), wherein the memory is otherwise operated in the SLC-mode for reliability reasons. This allows saving extra memory and easily facilitates updates of memories.

Figure 2:
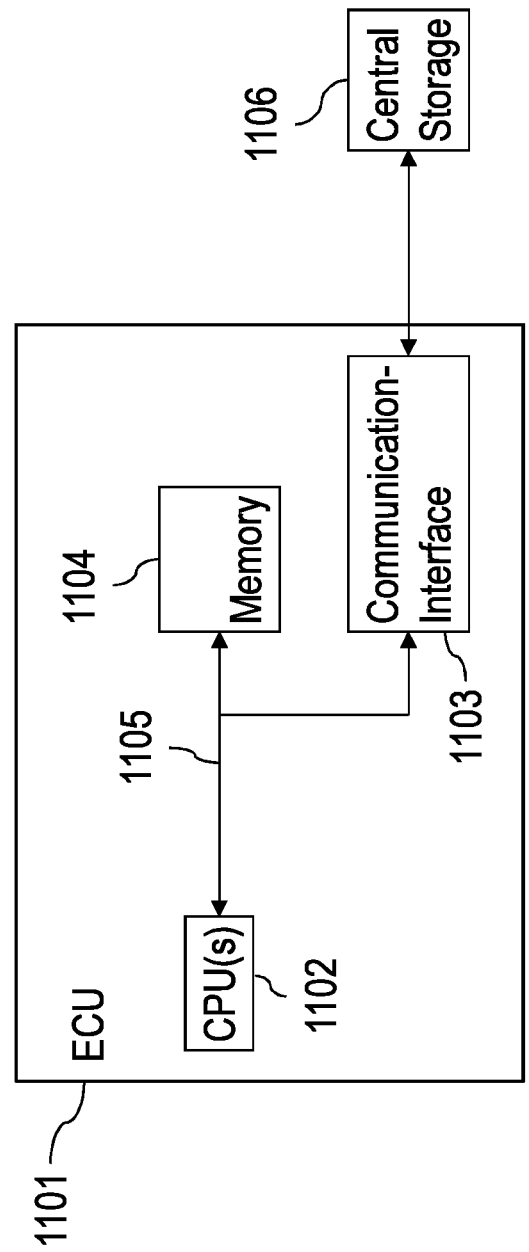
FIG. 2 shows a system comprising an Electronic Control Unit (ECU) that can be updated via a central storage.

FIG. 2 shows an exemplary ECU 1101 (ECU: Electronic Control Unit), which may be part of a vehicle, in particular a car. The ECU comprises one or more CPU(s) 1102, a memory 1104 and a communication interface 1103. The CPU 1102 may be coupled to the memory 1104 and the communication interface 1103 via a bus 1105. The communication interface 1103 is connectable (via an Internet-over-the-air connection) with a central or a local storage 1106, in particular an (remote) entity external to the ECU 1101 comprising such central storage 1106. The memory 1104 may correspond to the memory 100 in combination with the block 101 as shown in FIG. 1.

The CPU 1102, memory 1104, communication interface 1103 and bus 1105 may be integrated in an enhanced microcontroller system like Infineon's Aurix™ device.

The software update is conducted by transferring data from the central storage 1106 via the communication interface 1103 to the memory 1104.

It is an advantage that SOTA can be achieved with a high degree of reliability and flexibility at a reduced cost, due to the amount of memory required.

The memory may advantageously be capable of allowing separate write (incl. verify) and read accesses (simultaneously or substantially simultaneously) to the different memory areas. The update of the software may hence be conducted during the runtime of a vehicle.

It is noted that SOTA is an example that may be used in combination with the solutions described herein. However, the disclosure is not restricted to the SOTA scenario. It may be applicable, e.g., for any other approach that temporarily utilizes a portion of a memory for update, correction or revision purposes.

The examples suggested herein may in particular be based on at least one of the following solutions. In particular combinations of the following features could be utilized in order to reach a desired result. The features of the method could be combined with any feature(s) of the device, apparatus or system or vice versa.

A method is provided for updating a memory, wherein the memory comprises several blocks, wherein each of the blocks comprises multi-level cells and can be operated in an MLC-mode or in a SLC-mode, wherein each multi-level cell is capable of storing more than one bit, wherein the method comprises the following steps for each block to be updated:
 (a) copying a content of the block to a buffer block;
 (b) writing the content of the block from the buffer block and an updated content for this block to the block, utilizing the capability of the block to be operated in the MLC-mode;
 (c) copying the updated content of the block to the buffer block;
 (d) writing the updated content from the buffer block to the block, utilizing the capability of the block to be operated in the SLC-mode.

The multi-level cells of the memory may store two or more bits. The memory and each block of the memory can be operated in the MLC-mode, wherein the memory cells of the block affected by the MLC-mode store at least two bits. Also, the memory and each block of the memory can be operated in the SLC-mode, wherein the memory cells of the block affected by the SLC-mode store a single bit.

It is noted that the steps (a) and (b) can be executed for all blocks to be updated first and then the steps (c) and (d) are executed for these blocks.

The updated content may be provided by a local memory and/or via an external (e.g., central) memory.

In an embodiment,
 prior to step (a) the content of the block is read by accessing the block;
 after step (a) and before step (b) the content of the block is read by accessing the buffer block;
 after step (c) and before step (d) the updated content of the block is read by accessing the buffer block;
 after step (d) the updated content of the block is read by accessing the block.

In an embodiment,
 as long as step (b) is not yet conducted for all blocks, the content of the block is read by accessing the block and by masking the updated content,
 after step (b) is conducted for all blocks, the updated content of the block is read by accessing the block and by masking the content.

Hence, after step (b) the updated content as well as the (old) content are stored in the block, because the block being operated in the MLC-mode. It is thus possible to read either the content or the updated content from this block. The content may be read as long as the update for all blocks (to be updated) is not finished. After all such blocks are updated, it may be switched over to accessing the updated content (in these blocks) in particular as long as step (c) has not yet been conducted for the particular block. Accessing one of the contents out of two contents stored in the block can be achieved by masking the respective other content. Masking in this regard refers to any mechanism that enables selecting (in particular accessing, reading) one out of two (or more) contents.

In an embodiment, after step (a) and before step (b) the method comprises:
 (a1) erasing the block.

In an embodiment, after step (c) and before step (d) the method comprises:
 (c1) erasing the block.

In an embodiment, step (b) further comprises: entering the MLC-mode if a condition is fulfilled.

In an embodiment, the condition is fulfilled if at least one of the following
 a parameter,
 an internal temperature,
 an external temperature,
 a measured signal,
 a predetermined signal
fulfills a predetermined condition.

In an embodiment, the steps (a) and (b) are executed for all blocks to be updated and then the steps (c) and (d) are executed for all blocks to be updated.

In an embodiment, the buffer block is part of the memory or part of separate memory.

In an embodiment, the buffer block comprises memory cells that each can only store a single bit.

In an embodiment, the memory is operated at a first access time in the MLC-mode and at a access time in the SLC-mode, wherein the first access time is lower than the second access time.

In an embodiment, an integrity check for a block of the memory is executed before the MLC-mode is activated for this block.

In an embodiment, the memory is a Flash memory, in particular a PFlash memory.

In an embodiment, the method further comprises prior to step (a):
  receiving an update request.

In an embodiment,
  the update request is an update-over-the-air request, in particular a SOTA request or message and
  the updated content for the blocks to be updated is at least partially supplied via an air interface, in particular a mobile communication interface.

In an embodiment, the memory is part of an electronic control unit of a vehicle, in particular car.

Also, a device is suggested for updating a memory, wherein the memory comprises
  several blocks,
    wherein each of the blocks comprises multi-level cells, wherein each multi-level cell is capable of storing more than one bit,
    wherein each of the blocks can be operated in an MLC-mode or in a SLC-mode,
  wherein the device comprises a processing unit that is arranged for
    (a) copying the content of the block to a buffer block;
    (b) writing the content of the block from the buffer block and an updated content for this block to the block, utilizing the capability of the block to be operated in the MLC-mode;
    (c) copying the updated content of the block to the buffer block;
    (d) writing the updated content from the buffer block to the block, utilizing the capability of the block to be operated in the SLC-mode.

In an embodiment, the device is part of an Electronic Control Unit of a vehicle.

In an embodiment, the updated content is supplied via an air interface, in particular a mobile communication interface.

In an embodiment, the memory array comprises at least one of the following:
  floating gate cells,
  PCRAM,
  RRAM,
  MRAM,
  CBRAM,
  FERAM,
  MONOS devices,
  nanocrystal cells,
  ROM.

In an embodiment, the processing unit is further arranged for conducting after step (a) and before step (b):
  (a1) erasing the block.

In an embodiment, the processing unit is further arranged for conducting after step (c) and before step (d):
  (c1) erasing the block.

Further, a computer program product is suggested that is directly loadable into a memory of a digital processing device, comprising software code portions for performing the steps of the method as described herein.

Also, a computer-readable medium is provided, which has computer-executable instructions adapted to cause a computer system to perform the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for updating a memory, which comprises several blocks, wherein each of the several blocks comprises multi-level cells each of which is configured to store one or more bits, wherein the method comprises, for each block to be updated:
   (a) copying a content of the block to a buffer block while the block is operating in an SLC-mode;
   (b) writing the content of the block from the buffer block and an updated content together in the block when the block is operating in an MLC-mode;
   (c) copying the updated content, without the content, from the block to the buffer block; and
   (d) writing the updated content from the buffer block to the block while the block is operating in the SLC-mode,
   wherein the steps (a)-(d) are performed in the order recited.

2. The method according to claim 1, wherein:
   prior to the step (a), the content of the block is read by accessing the block;
   after the step (a) and before the step (b), the content of the block is read by accessing the buffer block;
   after the step (c) and before the step (d), the updated content of the block is read by accessing the buffer block; and
   after the step (d), the updated content of the block is read by accessing the block.

3. The method according to claim 1, wherein:
   as long as the step (b) is not yet conducted for all blocks, the content of the block is read by accessing the block and by masking the updated content, and
   after the step (b) is conducted for all blocks, the updated content of the block is read by accessing the block and by masking the content.

4. The method according to claim 1, wherein after the step (a) and before the step (b) the method comprises:
   (a1) erasing the block.

5. The method according to claim 1, wherein after the step (c) and before the step (d), the method comprises:
   (c1) erasing the block.

6. The method according to claim 1, wherein the step (b) further comprises entering the MLC-mode if a condition is fulfilled.

7. The method according to claim 6, wherein the condition is fulfilled if a parameter, an internal temperature, an external temperature, a measured signal, or a predetermined signal fulfills a predetermined condition.

8. The method according to claim 1, wherein the steps (a) and (b) are executed for all blocks to be updated and then the steps (c) and (d) are executed for all blocks to be updated.

9. The method according to claim 1, wherein the buffer block is part of the memory or part of separate memory.

10. The method according to claim 1, wherein the buffer block comprises memory cells that each can only store a single bit.

11. The method according to claim 1, wherein the memory is operated at a first access time in the MLC-mode and at a second access time in the SLC-mode, wherein the first access time is less than the second access time.

12. The method according to claim 1, wherein an integrity check for a block of the memory is executed before the MLC-mode is activated for this block.

13. The method according to claim 1, wherein the memory is a PFlash memory.

14. The method according to claim 1, further comprising prior to the step (a):
   receiving an update request.

15. The method according to claim 14, wherein:
   the update request is a Software Over the Air (SOTA) request or message, and
   the updated content for the blocks to be updated is at least partially supplied via a mobile communication interface.

16. The method according to claim 1, wherein the memory is part of an electronic control unit of a car.

17. A device for updating a memory, which comprises:
   several blocks, wherein each of the blocks comprises multi-level cells, wherein each multi-level cell configured to store one or more bits,
   wherein the device comprises a processor that is arranged for:
   (a) copying the content of the block to a buffer block while the block is operating in an SLC-mode;
   (b) writing the content of the block from the buffer block and an updated content together in the block while the block is operating in an MLC-mode;
   (c) copying the updated content, without the content, from the block to the buffer block; and
   (d) writing the updated content from the buffer block to the block while the block is operating in the SLC-mode,
   wherein the steps (a)-(d) are performed in the order recited.

18. The device according to claim 17, wherein the device is part of an Electronic Control Unit of a vehicle.

19. The device according to claim 17, wherein the updated content is supplied via an air interface, in particular a mobile communication interface.

20. The device according to claim 17, wherein the memory array comprises floating gate cells, PCRAM, RRAM, MRAM, CBRAM, FERAM, MONOS devices, nanocrystal cells, or ROM.

21. The device according to claim 17, wherein the processor is further arranged for conducting after the step (a) and before the step (b):

(a1) erasing the block.

22. The device according to claim 17, wherein the processor is further arranged for conducting after the step (c) and before the step (d):

(c1) erasing the block.

23. A non-transitory computer-readable medium having computer-executable instructions adapted to cause a computer system to perform the steps of the method according to claim 1.

* * * * *